(12) United States Patent
  Horan et al.

(10) Patent No.: US 12,672,551 B2
(45) Date of Patent: Jun. 30, 2026

(54) TRANSFORMER-BASED ISOLATOR WITH SENSE COIL

(71) Applicant: Allegro MicroSystems, LLC, Manchester, NH (US)

(72) Inventors: John Horan, Cork (IE); Paddy Collins, Cork (IE)

(73) Assignee: Allegro MicroSystems, LLC, Manchester, NH (US)

( * ) Notice: Subject to any disclaimer, the term of this patent is extended or adjusted under 35 U.S.C. 154(b) by 676 days.

(21) Appl. No.: 18/321,859

(22) Filed: May 23, 2023

(65) Prior Publication Data

US 2024/0395736 A1    Nov. 28, 2024

(51) Int. Cl.

| | |
|---|---|
| *H01F 27/32* | (2006.01) |
| *H01L 23/495* | (2006.01) |
| *H01L 25/065* | (2023.01) |
| *H02M 3/335* | (2006.01) |
| *H10W 44/00* | (2026.01) |
| *H10W 70/40* | (2026.01) |
| *H10W 90/00* | (2026.01) |

(52) U.S. Cl.
CPC ........ *H10W 44/501* (2026.01); *H01F 27/324* (2013.01); *H02M 3/33523* (2013.01); *H10W 70/415* (2026.01); *H10W 70/465* (2026.01); *H10W 90/00* (2026.01); *H10W 90/752* (2026.01)

(58) Field of Classification Search
CPC ............. H10W 20/497; H10W 44/501; H10W 70/415; H10W 70/465; H10W 90/00; H10W 90/752; H01F 27/324; H01F 2019/085; H02M 3/33523
See application file for complete search history.

(56) References Cited

U.S. PATENT DOCUMENTS

| | | | |
|---|---|---|---|
| 4,461,966 | A | 7/1984 | Hebenstreit |
| 4,748,351 | A | 5/1988 | Barzegar |
| 4,970,420 | A | 11/1990 | Billings |
| 5,019,719 | A | 5/1991 | King |

(Continued)

FOREIGN PATENT DOCUMENTS

| | | |
|---|---|---|
| CN | 105301320 A | 2/2016 |
| DE | 3700488 A1 | 7/1988 |

(Continued)

OTHER PUBLICATIONS

Response (with English Translation) to Taiwan Office Action dated Sep. 11, 2025 for Taiwan Application No. 113119158; Response Filed Nov. 12, 2025; 32 Pages.

(Continued)

*Primary Examiner* — David C Spalla

(74) *Attorney, Agent, or Firm* — DALY, CROWLEY, MOFFORD & DURKEE, LLP

(57) ABSTRACT

Aspects of the present disclosure include systems, structures, integrated circuit (IC) packages or modules, circuits, and methods providing a transformer with first and second coils and a sense coil configured adjacent to and closely coupled with the second coil. The circuits, ICs and IC packages and modules may include various types of circuits. In some examples, IC packages or modules may include a galvanically-isolated gate driver or other high voltage circuit.

29 Claims, 12 Drawing Sheets

(56) References Cited

U.S. PATENT DOCUMENTS

| | | | |
|---|---|---|---|
| 5,051,609 | A | 9/1991 | Smith |
| 5,430,613 | A | 7/1995 | Hastings et al. |
| 5,598,135 | A | 1/1997 | Maeda et al. |
| 5,847,631 | A | 12/1998 | Taylor et al. |
| 5,959,846 | A | 9/1999 | Noguchi et al. |
| 6,107,860 | A | 8/2000 | Vinciarelli |
| 6,181,130 | B1 | 1/2001 | Hoshi et al. |
| 6,281,560 | B1 | 8/2001 | Allen et al. |
| 6,377,155 | B1 | 4/2002 | Allen et al. |
| 6,775,901 | B1 | 8/2004 | Lee et al. |
| 6,791,851 | B2 | 9/2004 | Brkovic |
| 7,023,315 | B2 | 4/2006 | Yeo et al. |
| 7,075,329 | B2 | 7/2006 | Chen et al. |
| 7,119,448 | B1 | 10/2006 | de Stasi |
| 7,173,835 | B1 | 2/2007 | Yang |
| 7,663,351 | B2 | 2/2010 | Korsunsky |
| 7,683,654 | B2 | 3/2010 | Chen et al. |
| 7,692,444 | B2 | 4/2010 | Chen et al. |
| 7,719,112 | B2 | 5/2010 | Shen |
| 7,804,697 | B2 | 9/2010 | Melanson |
| 7,868,431 | B2 | 1/2011 | Feng et al. |
| 7,920,010 | B2 | 4/2011 | Chen et al. |
| 8,063,689 | B2 | 11/2011 | Theiler |
| 8,094,458 | B2 | 1/2012 | Furnival |
| 8,217,748 | B2 | 7/2012 | Feng et al. |
| 8,385,043 | B2 | 2/2013 | Ng et al. |
| 8,680,837 | B2 | 3/2014 | Zeng et al. |
| 8,736,343 | B2 | 5/2014 | Chen et al. |
| 8,816,666 | B2 | 8/2014 | Kimura et al. |
| 9,048,020 | B2 | 6/2015 | Calvillo Cortes et al. |
| 9,660,584 | B2 | 5/2017 | Modi et al. |
| 9,743,523 | B2 | 8/2017 | Huang et al. |
| 9,847,166 | B2 | 12/2017 | Kneller |
| 9,887,034 | B2 | 2/2018 | Francis |
| 9,899,140 | B2 | 2/2018 | Kneller et al. |
| 9,922,764 | B2 | 3/2018 | Kneller et al. |
| 9,948,294 | B2 | 4/2018 | Peter et al. |
| 9,998,301 | B2 | 6/2018 | Yun et al. |
| 10,002,703 | B2 | 6/2018 | Wang et al. |
| 10,014,798 | B1 | 7/2018 | Vinciarelli |
| 10,062,495 | B2 | 8/2018 | Lloyd |
| 10,176,917 | B2 | 1/2019 | Parish et al. |
| 10,217,558 | B2 | 2/2019 | Kneller |
| 10,224,143 | B2 | 3/2019 | Kneller et al. |
| 10,229,779 | B2 | 3/2019 | Harber |
| 10,234,513 | B2 | 3/2019 | Vig et al. |
| 10,256,027 | B2 | 4/2019 | Li et al. |
| 10,319,509 | B2 | 6/2019 | Kneller et al. |
| 10,347,413 | B2 | 7/2019 | Francis |
| 10,573,457 | B2 | 2/2020 | Wang et al. |
| 10,811,181 | B2 | 10/2020 | Parish et al. |
| 10,930,422 | B2 | 2/2021 | Francis |
| 11,139,102 | B2 | 10/2021 | Kneller et al. |
| 11,201,619 | B2 | 12/2021 | Rinne et al. |
| 11,211,929 | B2 | 12/2021 | Rinne et al. |
| 11,282,631 | B2 | 3/2022 | Francis |
| 2008/0179963 | A1* | 7/2008 | Fouquet ................ H01F 19/08 |
| | | | 336/200 |

| | | | |
|---|---|---|---|
| 2009/0147544 | A1 | 6/2009 | Melanson |
| 2009/0237899 | A1 | 9/2009 | Furnival |
| 2010/0020448 | A1 | 1/2010 | Ng et al. |
| 2011/0175642 | A1 | 7/2011 | Chen et al. |
| 2012/0008344 | A1 | 1/2012 | Zeng et al. |
| 2012/0206171 | A1 | 8/2012 | Kimura et al. |
| 2013/0293268 | A1 | 11/2013 | Draxelmayr et al. |
| 2016/0181004 | A1 | 6/2016 | Li et al. |
| 2018/0190855 | A1* | 7/2018 | Male ...................... H10F 55/25 |
| 2019/0326872 | A1 | 10/2019 | Cheng et al. |
| 2019/0355633 | A1* | 11/2019 | Liu ..................... H10W 76/138 |
| 2021/0376822 | A1 | 12/2021 | Thompson et al. |
| 2022/0116036 | A1 | 4/2022 | Rinne et al. |

FOREIGN PATENT DOCUMENTS

| | | | |
|---|---|---|---|
| DE | 10 2004 033 125 | A1 | 2/2006 |
| GB | 2 250 383 | A | 6/1992 |
| GB | 2 341 288 | A | 3/2000 |
| JP | H01300617 | A | 12/1989 |
| JP | 2001 167941 | A | 6/2001 |
| JP | 2003 234234 | A | 8/2003 |
| JP | 2008 072021 | A | 3/2008 |
| WO | WO 93/21690 33 | | 10/1993 |
| WO | WO 95/12247 14 | | 5/1995 |
| WO | WO 2004/100473 | A2 | 11/2004 |
| WO | WO 2009/008739 | A1 | 1/2009 |
| WO | WO 2010/061281 | A2 | 6/2010 |
| WO | WO 2011/137845 | A1 | 11/2011 |
| WO | WO 2021/211920 | A1 | 10/2021 |

OTHER PUBLICATIONS

Bourgeois, "An Isolated Gate 25 Drive For Power MOSFETs and IGBTs", STMicroelectronics Group, AN461/0194, 1999; 7 pages.

"ADuM4135 Data Sheet, Single-/Dual-Supply, High Voltage Isolated IGBT Gate Driver with Miller Clamp", Analog Devices Inc., Rev. E, 2015; 17 pages.

"Si827x", Datasheet Rev. 0.5, Silicon Laboratories Inc., 2016; 43 pages.

Fandrich, Cory Lynn, "An On-Chip Transformer-Based Digital Isolator System", Master's Thesis, University of Tennessee, Dec. 2013; 68 pages.

Taiwan Office Action (with English Translation) dated Sep. 11, 2025 for Taiwan Application No. 113119158; 7 Pages.

U.S. Appl. No. 18/192,932, filed Mar. 30, 2023, Horan et al.

U.S. Appl. No. 18/297,034, filed Apr. 7, 2023, Torti.

U.S. Appl. No. 18/300,708, filed Apr. 14, 2023, Mangtani et al.

U.S. Appl. No. 18/300,711, filed Apr. 14, 2023, Taylor et al.

U.S. Appl. No. 18/302,998, filed Apr. 19, 2023, Salato et al.

U.S. Appl. No. 18/303,740, filed Apr. 20, 2023, Horan et al.

U.S. Appl. No. 18/307,921, filed Apr. 27, 2023, Salato et al.

International Search Report and Written Opinion dated Apr. 9, 2024, for International Patent Application No. PCT/US2024/016832; 11 pages.

Taiwan Notice of Allowance (with English Translation and Allowed Claims) dated Jan. 23, 2026 for Taiwan Application No. 113119158; 9 Pages.

* cited by examiner

Mid Sense Coil
635

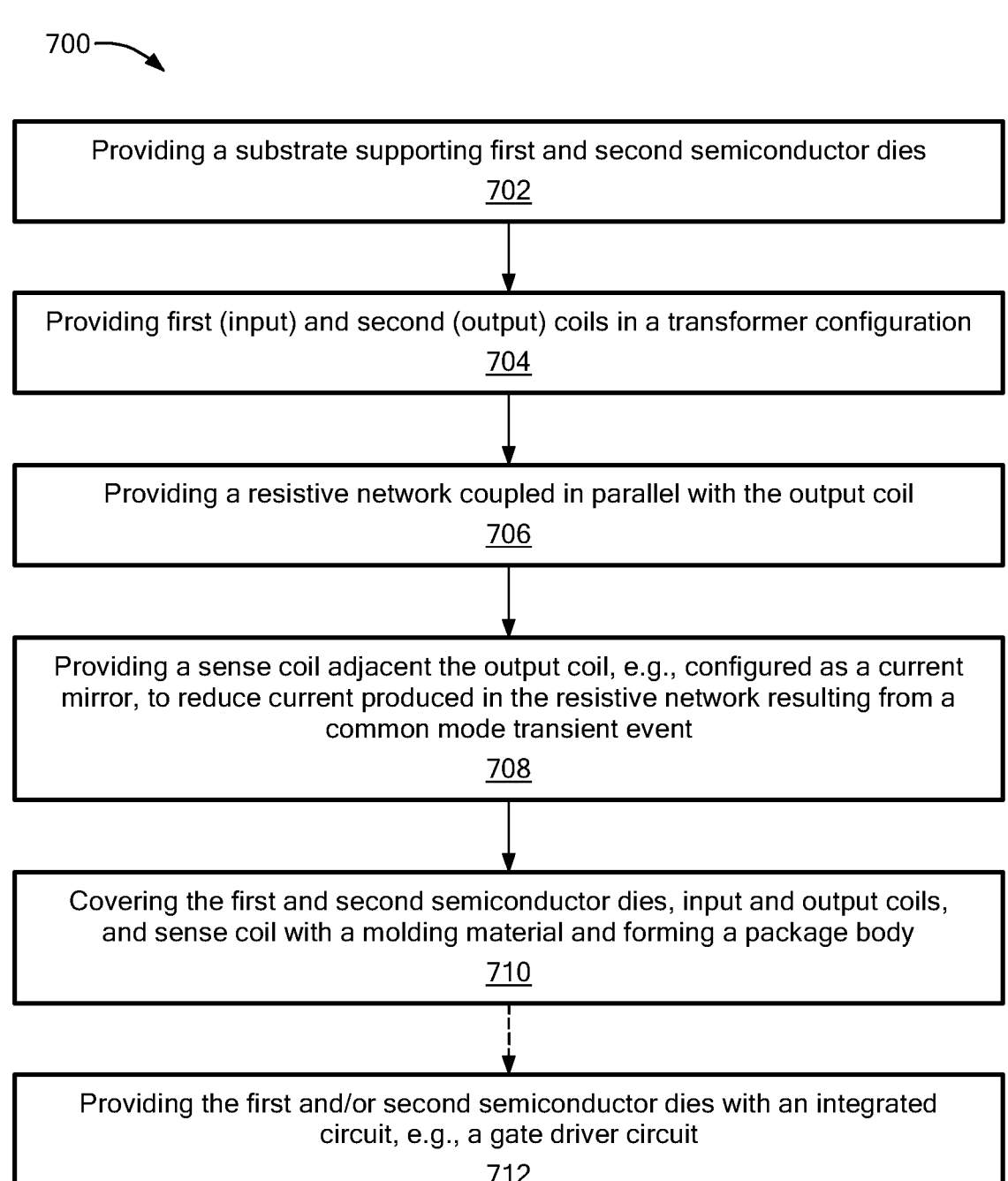

700

Providing a substrate supporting first and second semiconductor dies
702

Providing first (input) and second (output) coils in a transformer configuration
704

Providing a resistive network coupled in parallel with the output coil
706

Providing a sense coil adjacent the output coil, e.g., configured as a current mirror, to reduce current produced in the resistive network resulting from a common mode transient event
708

Covering the first and second semiconductor dies, input and output coils, and sense coil with a molding material and forming a package body
710

Providing the first and/or second semiconductor dies with an integrated circuit, e.g., a gate driver circuit
712

*FIG. 7*

TRANSFORMER-BASED ISOLATOR WITH SENSE COIL

BACKGROUND

Solid state switches typically include a transistor structure. The controlling electrode of the switch, usually referred to as its gate (or base), is typically controlled (driven) by a switch drive circuit, sometimes also referred to as gate drive circuit. Such solid state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid state switches, have employed galvanic isolation to prevent undesirable DC currents flowing from one side of an isolation barrier to the other. Galvanic isolation can be used to separate circuits in order to protect users from coming into direct contact with hazardous voltages, which can be present for high-power solid state switches.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

Such magnetic-coupling isolation barriers have exhibited susceptibility to so-called common mode interference, also known as common mode transient (CMT) events. Common mode transient interference (CMTI) is typically defined as the maximum tolerable rate of rise or fall (per unit time) of the common mode voltage applied between two isolated circuits.

FIG. 1 shows a schematic view of a prior art transformer-based galvanically isolated power supply circuit 100. Circuit 100 includes a primary side 110, a secondary side 120, and a transformer 130. In circuit 100, CMOS switch 112, with two complementary MOSFETs shown, provides an output voltage across source coil 112 of primary side 110. Receiver coil 122 of secondary side 120 is configured for magnetic coupling (represented by M) with source coil 112 for transformer 130. Diode rectifier bridge 124 is coupled to receiver coil 122 and Vout sensor 126. The output of Vout sensor 126 is provided to controller 152, which is connected to cross-isolation block 154. Switch driver 156 is connected to cross-isolation block 154 and to CMOS switch 112 for controlling switch 112. Capacitors 118, 123 on the primary side and secondary side, respectively, provide a resonant frequency to circuit 100.

In operation, circuit 100 sends an AC signal through transformer 130, and this signal is rectified on the secondary side 120 of the transformer to produce a DC voltage which appears across the capacitor 127 and the load 128. The transformer 130 provides isolation in circuit 100 and can be used to scale up the incoming voltage to provide for larger DC voltages at the output. When the switching frequency deviates from the resonant frequency the power transfer is reduced. For circuit 100, the output voltage is sensed, with the controller 152 comparing the sensed output voltage to a target value. Based on this comparison, the controller 152 operates to increase or decrease the power supplied by the driver, sending control signals across cross isolation block 154 to switch driver 156 for control of switch 112. An example isolation barrier would be two layers of a PCB separated by, e.g., 0.5 mm.

In applications where the transformer 130 is built into a printed circuit board (PCB), there may be inefficiencies resulting from poor coupling between the primary and secondary coils of the PCB transformer. In applications where the isolation required is large, for example 6000 volts, the increased distance between the layers of the PCB can result in a transformer coupling factor as low as 0.6. This can significantly reduce the efficiency of the power supply.

FIG. 2 shows a schematic view of prior art data transmission circuit 200 for sending control signals across a transformer-based isolation barrier, such as shown in FIG. 1. Primary side (transmitter) circuitry 210 includes first and second CMOS switches 212, 214 and primary coil 216. Secondary side (receiver) circuitry 220 includes secondary coil 222 and differential amplifier 230 configured to produce differential output 232. Primary coil 216 and secondary coil 222 are configured as a transformer 240 along with core 242.

The circuit schematic also includes a noise injection sub-circuit 250, configured to injects a high dV/dt common-mode voltage (VCM), representing common-mode noise, between VSS1 and VSS2 for CMTI testing. This common-mode noise is coupled through capacitances of transformer 240 to the receiver (secondary) side circuitry 220.

Circuit 200, as implemented on a chip, can result in a 7 kV/μs common mode transient immunity. One of the issues identified as a problem in for circuit 200 is the current that flows from the high side to the low side during a common mode event, e.g., common mode transient interference (CMTI) event.

SUMMARY

An aspect of the present disclosure includes a galvanically-isolated (voltage-isolated) integrated circuit (IC) package providing high common mode noise rejection. The galvanically-isolated IC package may include a substrate; first and second semiconductor dies disposed on the substrate; a molding material configured to cover a portion of the substrate and forming a package body; an input coil disposed within the package body; an output coil disposed within the package body; where the input and output coils are configured as a transformer and connected to the first and second semiconductor dies, respectively; a resistive network coupled in parallel with the output coil; and a sense coil configured in parallel with the output coil, where the sense coil is configured for magnetic coupling with the output coil; and where the sense coil is configured to, in response to a common mode transient event producing current flow between the input and output coils due to capacitive coupling, accommodate a current flowing in the sense coil and thereby reduce current produced in the resistive network resulting from the common mode transient event.

Implementations may include one or more of the following features. The output coil of the IC package may include first and second portions. The sense coil may include first and second portions connected in series and configured in parallel with the first and second portions of the output coil. The resistive network may include first and second resistors connected in series. The first and/or second semiconductor dies may include an integrated circuit. The integrated circuit may include a gate driver circuit. The integrated may include a controller circuit or controller. The gate driver circuit may include a power switch. The power switch can include or can be configured to control a semiconductor power device, e.g., a power switch. The semiconductor power device may include a metal-oxide-semiconductor field-effect transistor (MOSFET), an insulated-gate bipolar transistor (IGBT), a silicon carbide FET (SIC FET), a gallium nitride FET (GaN FET), or a high-electron-mobility transistor (HEMT), etc. In some embodiments, the substrate may include a lead frame with first and second lead frame portions configured to receive the first and second semiconductor (IC) dies, respectively. In some embodiments, the substrate may include a printed circuit board (PCB). The PCB may include FR-4. In some embodiments, the substrate may include alumina.

One general aspect includes a method of making a galvanically-isolated integrated circuit package with a transformer and sense coil having one or more sense coil portions. The method may include: providing a substrate supporting first and second semiconductor (IC) dies; providing input and output coils in a transformer configuration, where the input and output coils are connected to the first and second semiconductor dies, respectively; providing a resistive network coupled in parallel with the output coil; providing a sense coil (with one or more portions) adjacent the output coil, where the sense coil is configured to, in response to a common mode transient event producing current flow between the input and output coils due to capacitive coupling, accommodate a current flowing in the sense coil and thereby reduce current produced in the resistive network resulting from the common mode transient event; and covering the first and second semiconductor dies, the input and output coils, and sense coil (sense coil portions) with a molding material forming a package body.

Implementations may include one or more of the following features. The output coil may include first and second portions. The sense coil may include first and second portions, e.g., connected in series and configured in parallel with the first and second portions of the output coil. The resistive network may include first and second resistors connected in series. The method may include connecting the output coil to a data receiver for controlling a solid state switch. The first and/or second semiconductor dies may include an integrated circuit. The integrated circuit may include a gate driver or controller. The gate driver circuit may include a power switch. The power switch is configured to control a semiconductor power device. The semiconductor power device may include a metal-oxide-semiconductor field-effect transistor (MOSFET), a gallium nitride (GaN) FET, a silicon carbide (SiC) FET, an insulated-gate bipolar transistor (IGBT), or a high-electron-mobility transistor (HEMT), etc. The substrate may include a lead frame with first and second lead frame portions configured to receive the first and second semiconductor dies, respectively. The substrate may include a printed circuit board (PCB). The PCB may include FR-4. The substrate may include alumina.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed examples and embodiments of the present disclose may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, examples and embodiments are illustrated by way of example and not limitation in the figures, in which:

FIG. 7 is a block diagram showing steps in an example fabrication method for a voltage-isolate integrated circuit package with transformer and sense coil, in accordance with the present disclosure.

DETAILED DESCRIPTION

The features and advantages described herein are not all-inclusive; additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing transformer-based isolation circuit with sense coils that function to reduce deleterious effects of common mode interference. To address common mode noise on the differential signal causing common mode movement of the differential signal, a sense coil can be configured across the output coils of the transformer, reducing the common mode movement in the differential signal. Examples and embodiments of the present disclosure provide or include a differential communications channel that can reject relatively large amounts of common mode voltage movement.

Examples and embodiments can include integrated circuit (IC) packages or modules with a voltage-isolation transformer providing galvanic isolation (voltage isolation) between a primary side and a secondary side. Examples and embodiments can include data transmitter and receiver for data communication across a transformer-based isolation barrier. The IC packages and modules may include various types of circuits; in some examples, IC packages or modules may include a galvanically isolated gate driver or other high voltage circuit, etc. First and second semiconductor or IC dies can be included in the package to provide integrated circuits (ICs), e.g., including, but not limited to, controllers and/or high-voltage circuits such as gate drivers configured to drive an external gate on a MOSFET, SiC FET, GaN FET, IGBT, high electron mobility transistor (HEMT), e.g., GaN HEMT, or another load.

Figure 1:
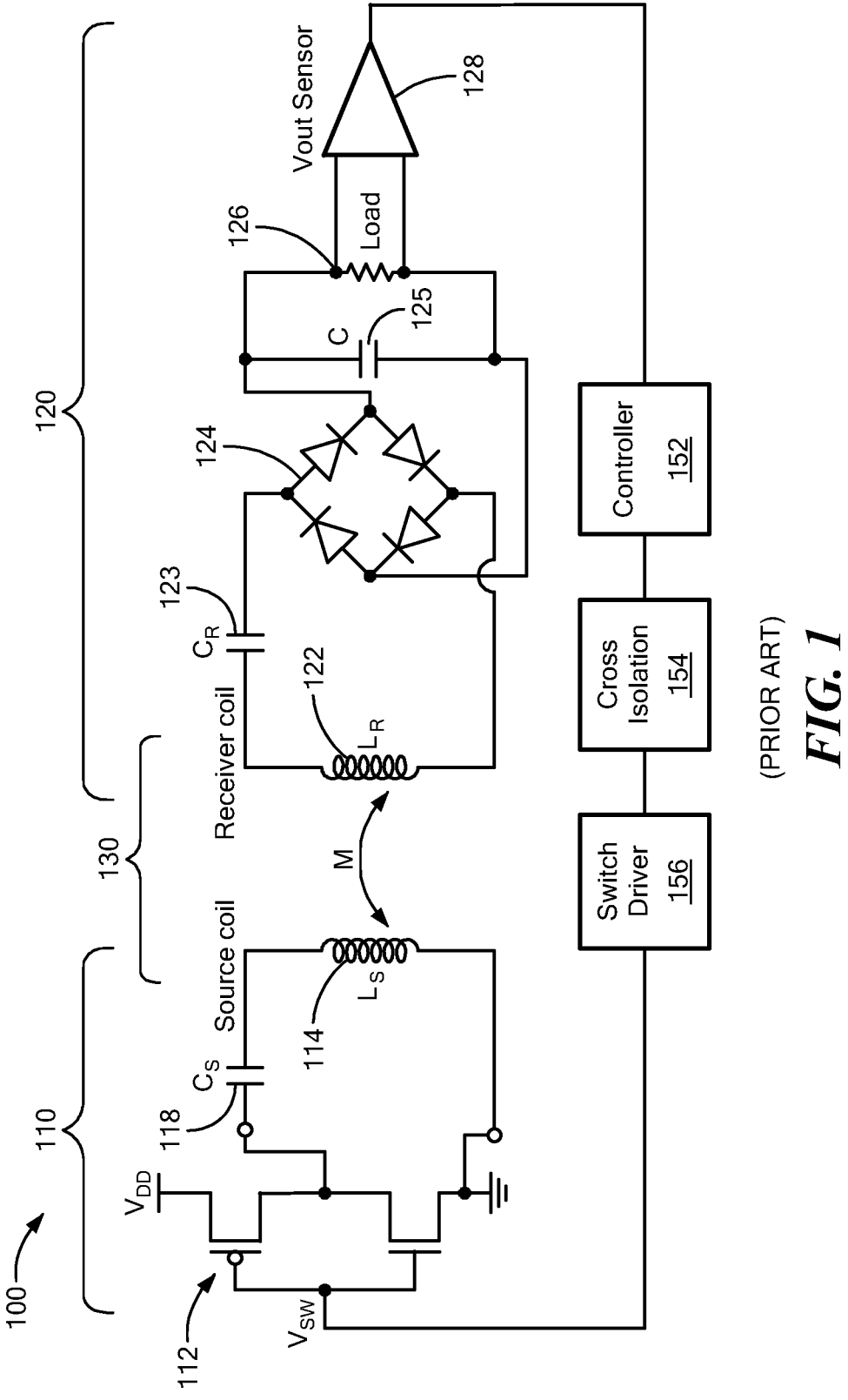
FIG. 1 is a schematic view of a prior art transformer-based isolated power supply.
Figure 2:
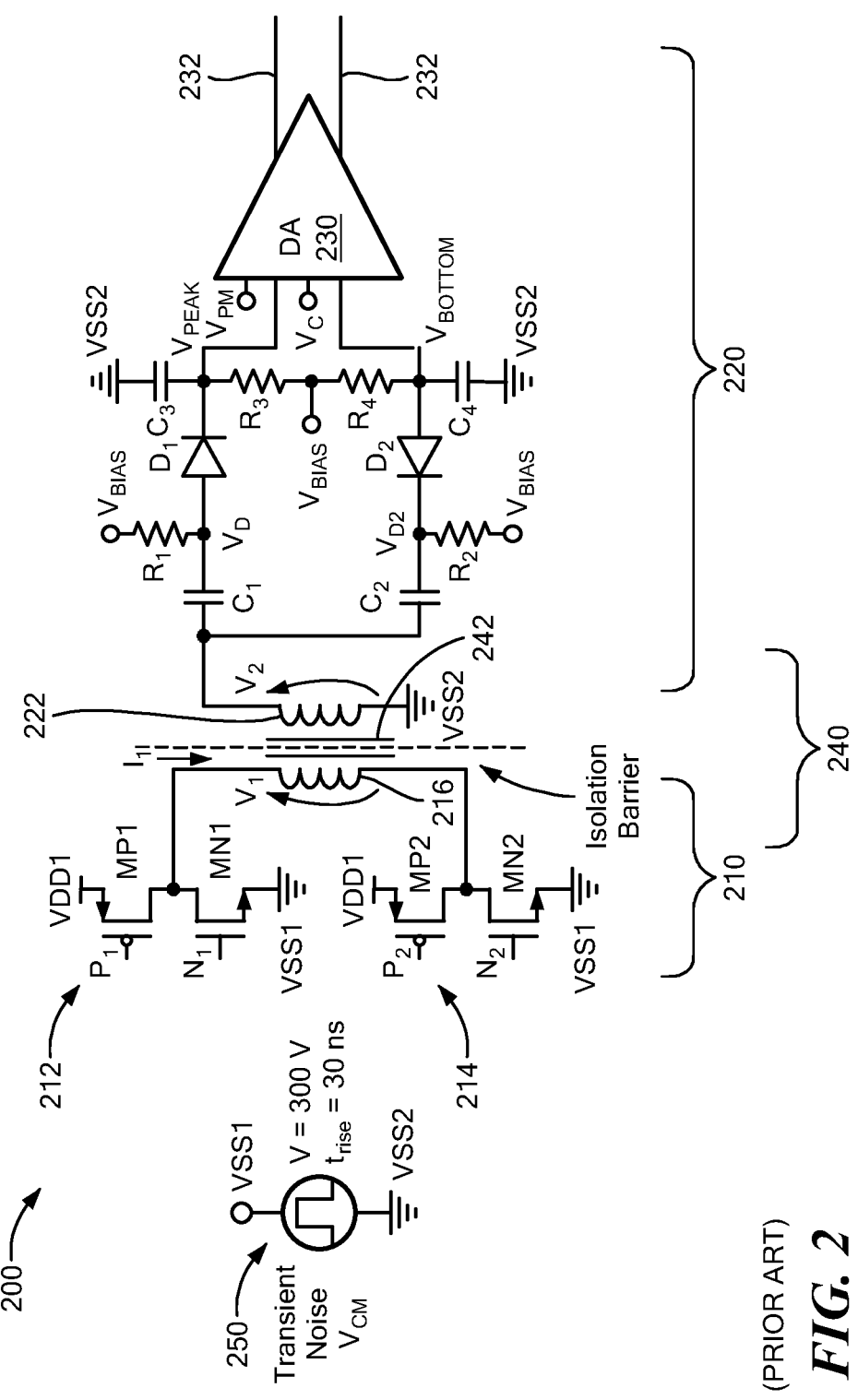
FIG. 2 is a schematic view of prior art data transmission circuit for sending control signals across a transformer-based isolation barrier as shown in FIG. 1.
Figure 3:
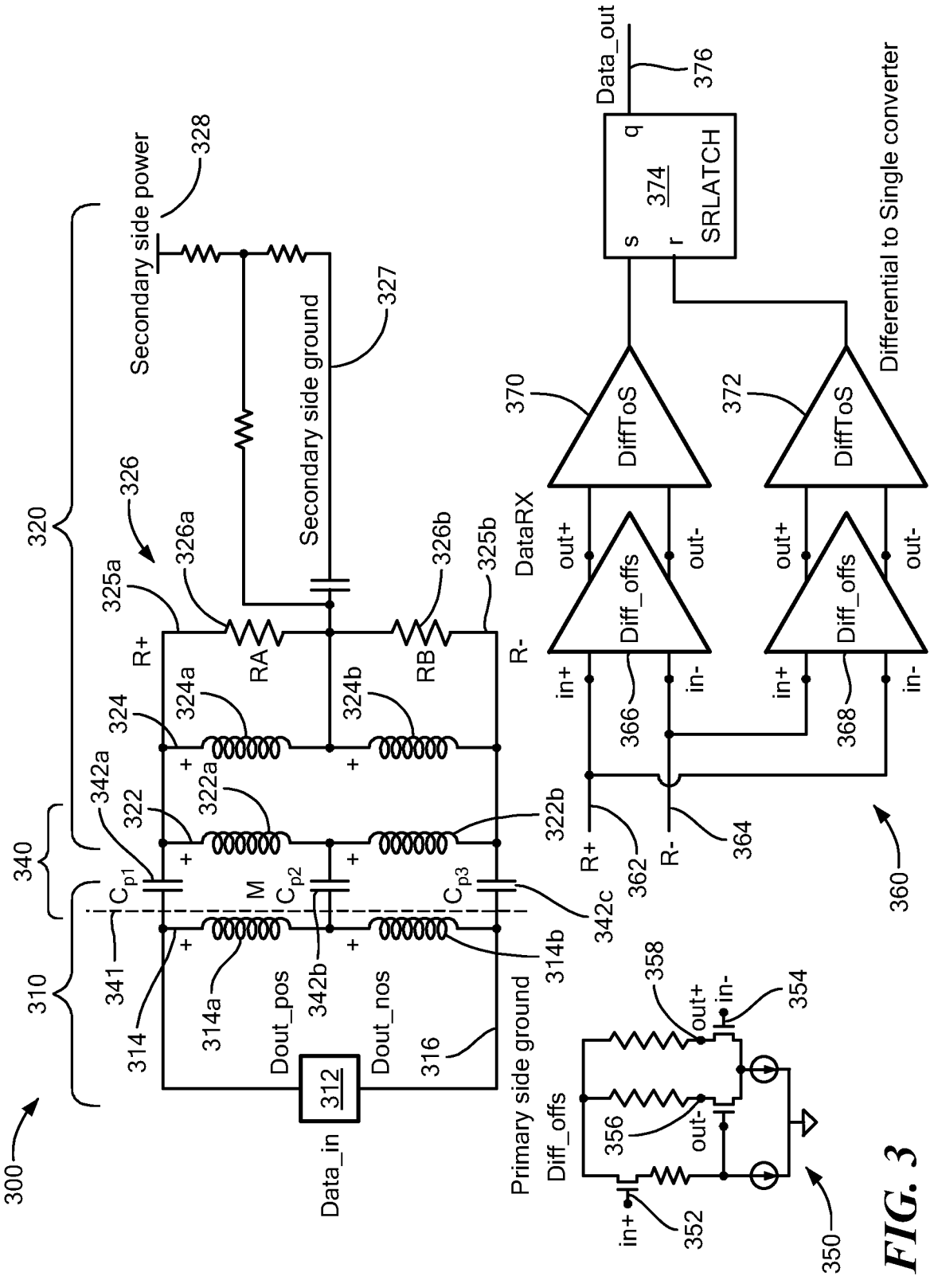
FIG. 3 is schematic diagram showing a data transmitter and receiver in a transformer-based isolation circuit having sense coils, in accordance with the present disclosure.

FIG. 3 is schematic diagram showing a data transmitter and receiver in a transformer-based isolation circuit 300 having sense coils, in accordance with the present disclosure. Circuit 300 includes primary (input) and secondary (output) sides 310, 320 magnetically coupled by transformer 340 (coupling indicated by "M"). Primary side 310 can include data input block 312, primary coil 314, shown having first and second coil portions 314*a-b*, and primary side ground 316, as shown. Magnetic coupling (M) allows data transmission across a dielectric boundary 341 (indicating galvanic isolation) between primary and secondary sides 310 and 320. In some examples, circuit 300 can be implemented on or in a suitable substrate, e.g., a printed circuit board (PCB), lead frame, etc. Examples of suitable PCB materials can include, but are not limited to, glass-reinforced epoxy laminate material, e.g., FR-4.

Secondary (output) side 320 can include secondary coil 322, shown having first and second coil portions 322*a-b*, and resistive network 326, e.g., with first and second resistors 326*a-b* in series, connected to secondary coil 322. Secondary side 320 can also include a sense coil 324, e.g., having first and second sense coils (sense coil portions) 324*a-b*. First and second sense coils (sense coil portions) 324*a-b* can be connected to secondary (output) coil 322, e.g., configured in parallel with first and second output (secondary) coil portions 322*a-b*, as shown. Secondary side ground 327 and power supply 328 are also shown. Parasitic capacitance, present between primary coil and secondary coil 322, is shown by parasitic capacitors 342*a-c* (shown as discrete elements even though this capacitance can be considered as distributed over the lengths of coils 314 and 322). Parasitic capacitance, or stray capacitance, is the result of a virtual capacitor formed between two conductive traces separated by a dielectric. Sense coils (a.k.a., sense coil portions) 324*a-b* are sufficiently close to secondary (output) coil portions 322*a-b* such that in operation sense coil portions 324*a-b* are closely coupled to secondary coil portions 322*a-b*. Primary, secondary, and sense coils 314, 322, and 324*a-b* can be made of or include any suitable conductive materials, e.g., copper, iron, aluminum, alloys of such metals, etc.

Circuit 300 includes data receiver (Rx) sub-circuit 360, as shown. Data inputs (R+, R−) 362, 364 can supply differential data signals to differential amplifiers with inbuilt offset ("Diff_offs") 366, 368, which then can provide the differential data signals to differential-to-single converters 370, 372. The structure of the Diff_offs 366, 368 is shown in 350, with inputs (in+, in−) 352, 354 and outputs (out+, out−) 356, 358 indicated. Differential-to-single converters 370, 372 can then provide the single-value data signals to latch (flip flop) 374 (shown as a set-reset latch) having data output 376 (shown as "Data_out").

Received data signals can be processed on the secondary (output) side by data receiver (Rx) sub-circuit 360, e.g., by connections at locations 325*a-b* to secondary side 320. The differential signal can be processed by the Data Rx circuit 360 to reproduce "Data_in" from the input (primary side) at the secondary (high) side "Data_out" 376. In some embodiments, received data signals may be used, e.g., for control of a solid state power switch.

First and second sense coils 324*a-b* accordingly function to reduce the common mode movement in the differential signal and thus address common mode noise that is present for the differential signal. Reduction in common mode movement can allow one or more follow-on amplifiers, e.g., differential amplifiers 366, 326 (which may have a limited common mode range) to better work with the differential signal.

Figure 4A:
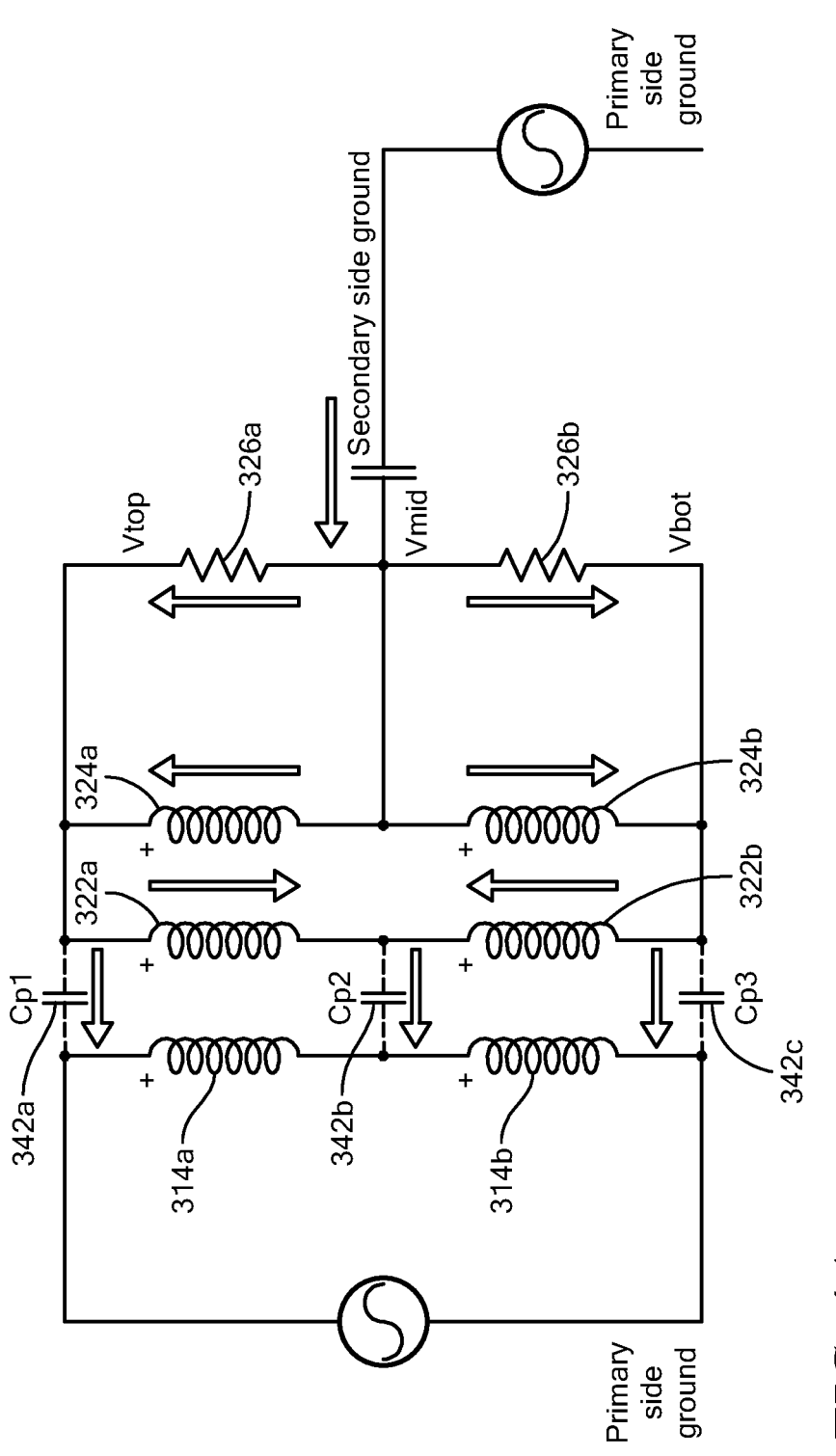
FIG. 4A shows an example of currents induced in the circuit of FIG. 3 in response to a common mode transient (CMT) event.

FIG. 4A shows an example of currents (indicated by arrows) induced in circuit 300 of FIG. 3 in response to a common mode transient (CMT) event. During a CMT event, current flowing in the parasitic capacitor (shown as 342*a-c*) between the output coil portions 322*a-322b* and the input coil portions 314*a-b* of the transformer 340 causes a corresponding current to flow in sense (coils) coil portions 324*a-b*, as shown. The common mode movement of the voltage is Vtop-Vmid; this will be the electromotive force (EMF) generated across coil sense coil portion 324*a*. According to Faraday's law, this EMF is given by the time derivative of the magnetic flux in sense coil portion 324*a*. During the CMT event, however, the closely-coupled secondary coil portion 322*a* experiences a similar current flowing in the reverse direction. Similar action applies for sense coil portion 3242*b* and secondary coil portion 322*b*. If the inductances in the coils (e.g., sense coil portion 324*a* and output coil portion 332*a*) are approximately the same then then the magnetic fluxes can cancel and the resultant EMF and thus the common mode current movement will be greatly reduced compared to a circuit without sense (coils) coil portions 324*a-b*. In some embodiments, sense coil portions 324*a-b* and output coil portions 332*a-b* can have equal or approximately equal inductance values; the noted coils and/or coil portions may have different inductance values in alternate embodiments.

Figure 4B:
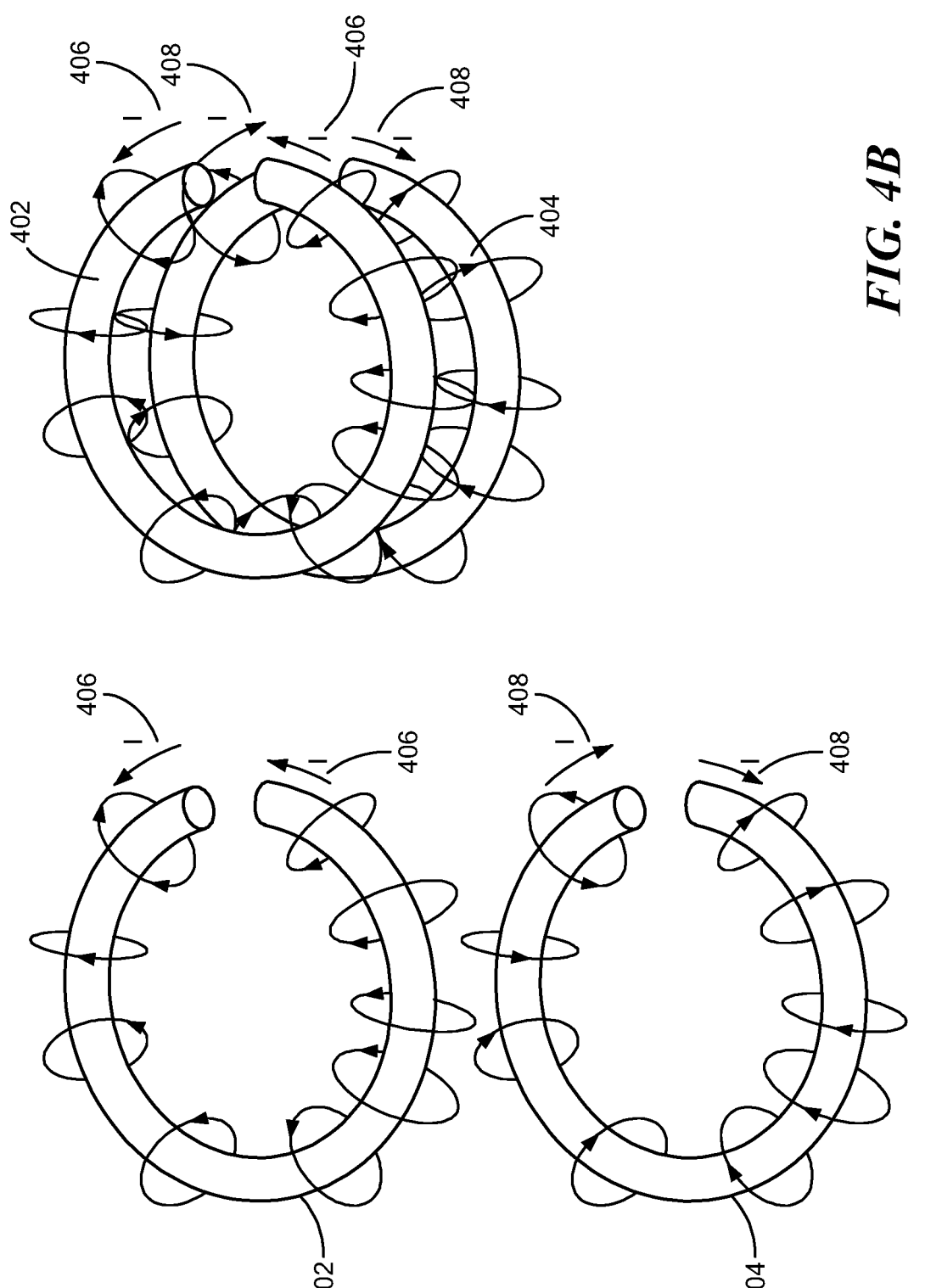
FIG. 4B shows examples of secondary and sense coils with and without close coupling.

FIG. 4B shows examples of secondary and sense coils with and without close coupling. The two coils 402, 404 (e.g., representing sense coil 324*a* and secondary coil portion 322*a* in FIG. 3) are shown with current flowing in opposite directions 406, 408 with corresponding directions of magnetic flux. In the left view, the coils 402, 404 are separate and little interference takes place between them. In the right view, the coils 402, 404 are brought closer to each other—in a closely-coupled configuration. The flux lines created by the coils 402, 404 are seen to oppose each other and consequently cancel each other, reducing the flux, flux derivative with time, and thus the EMF across the coils 402, 404.

Figure 5A:
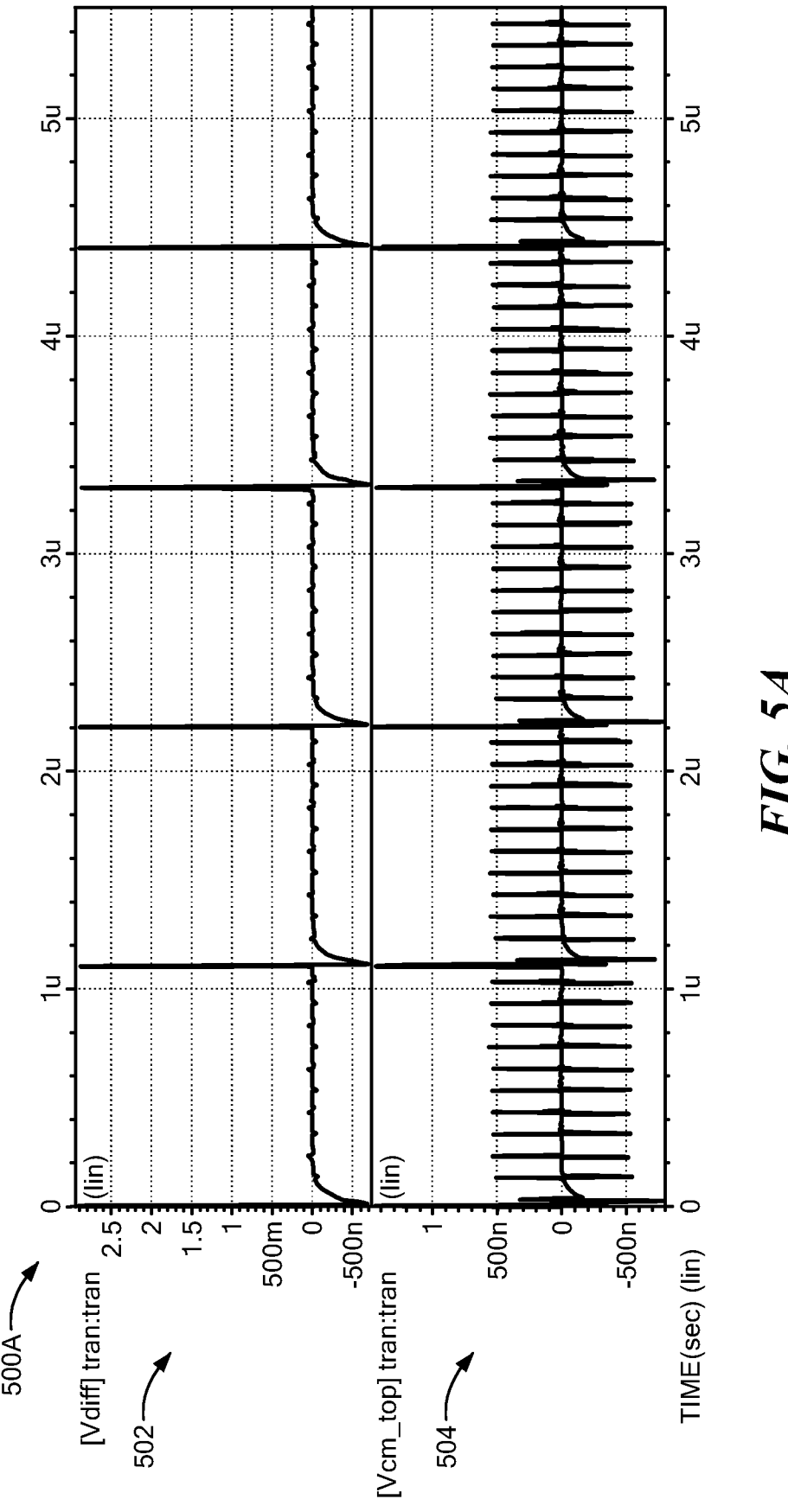
FIGS. 5A-5B show plotted simulation results of the circuit of FIG. 3 with and without sense coils, respectively, in accordance with the present disclosure.
Figure 5B:
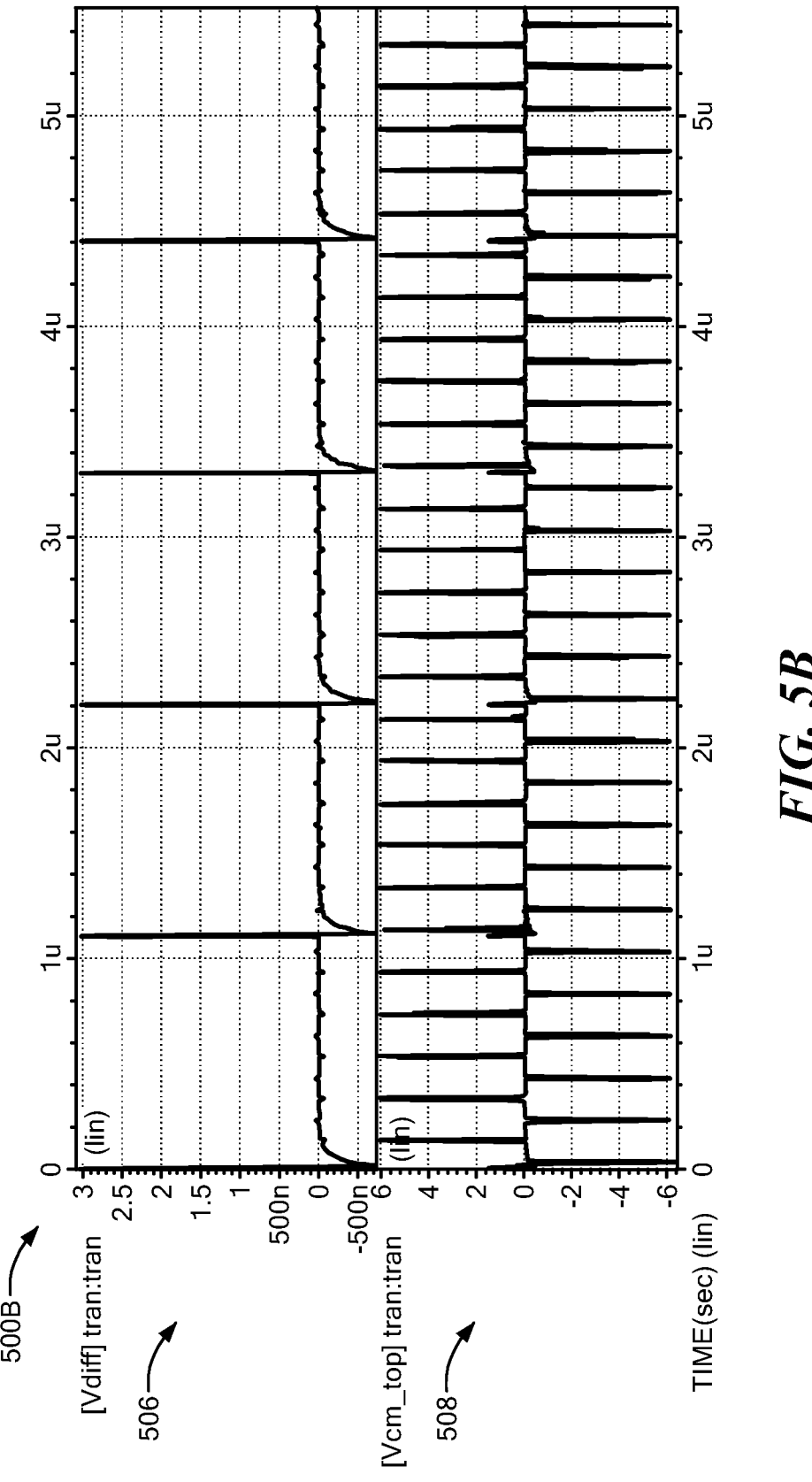

FIGS. 5A-5B show plotted simulation results of circuit 300 of FIG. 3 with and without sense coils, respectively, in accordance with the present disclosure. The simulation results in FIG. 5A show circuit 300 of FIG. 3 in operation, including Vdiff plot 502 and a Vcm plot 504. The vertical scale is in Volts, while the time scale on the horizontal axes is shown in microseconds (μs). For the simulation, a differential signal was passed through the system (corresponding to circuit 300) appearing between R+ and R−, this is shown as "Vdiff" in the plot. Another signal in the simulation is a 1 KV step over 5 ns in the common mode. This produced a movement in the node R+, shown as "Vcm_top" in the plot.

FIG. 5B includes Vdiff plot 506 and Vcm plot 508 and shows the same simulation as for FIG. 5A but without the sense coil portions (sense coils) 324a-b being included for circuit 300 shown in FIG. 3. As is shown, the movement in the common mode was +/−6V. This range would typically not be acceptable for the differential receiver circuit, demonstrating the need for/benefit from the sense coil 324, with sense coil portions 324a-b.

Figure 6A:
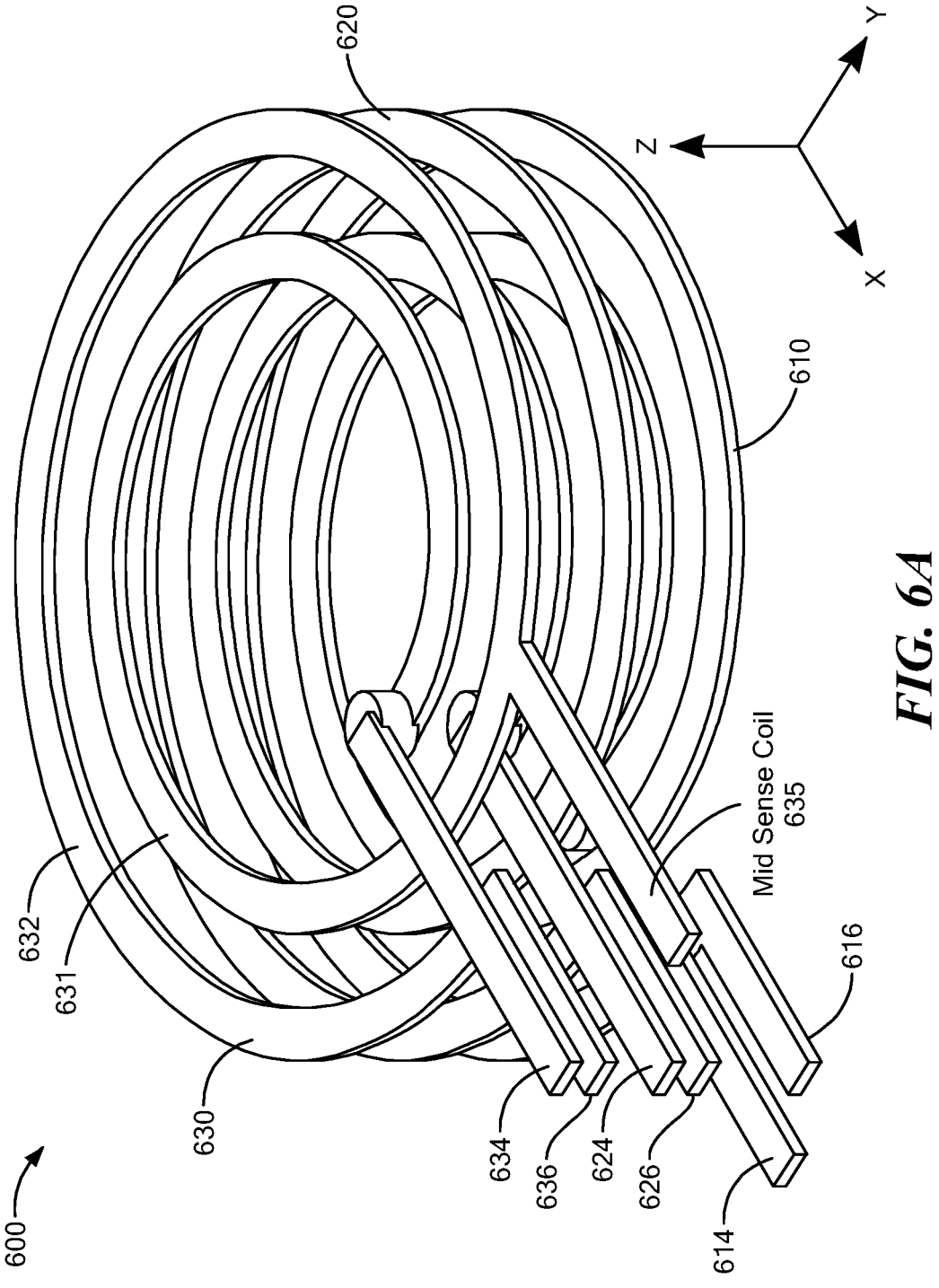
FIGS. 6A-6C are diagrams showing perspective, top, and side views, respectively, of a coil configuration having primary, secondary, and sense coils, in accordance with the present disclosure.
Figure 6B:
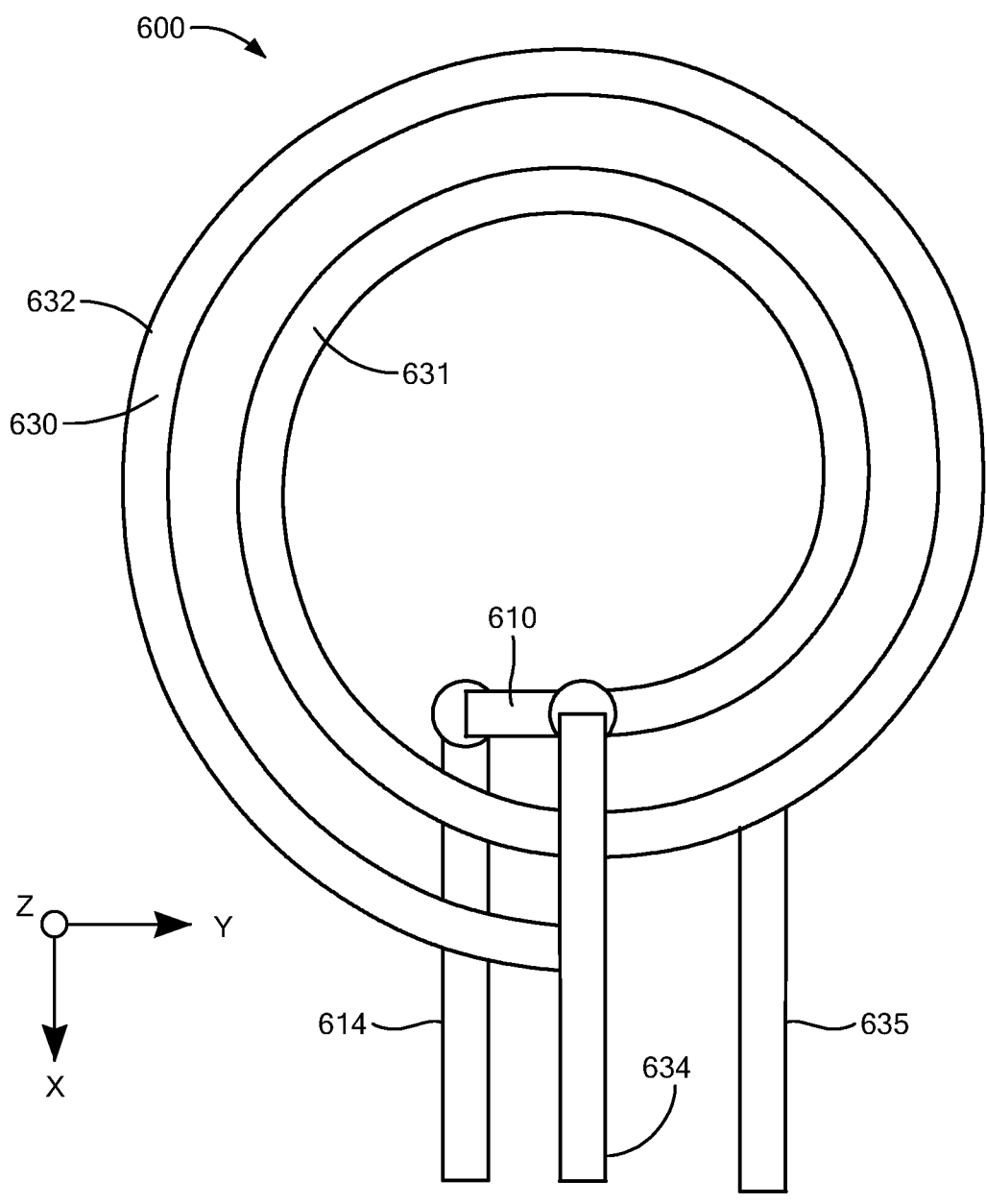
Figure 6C:
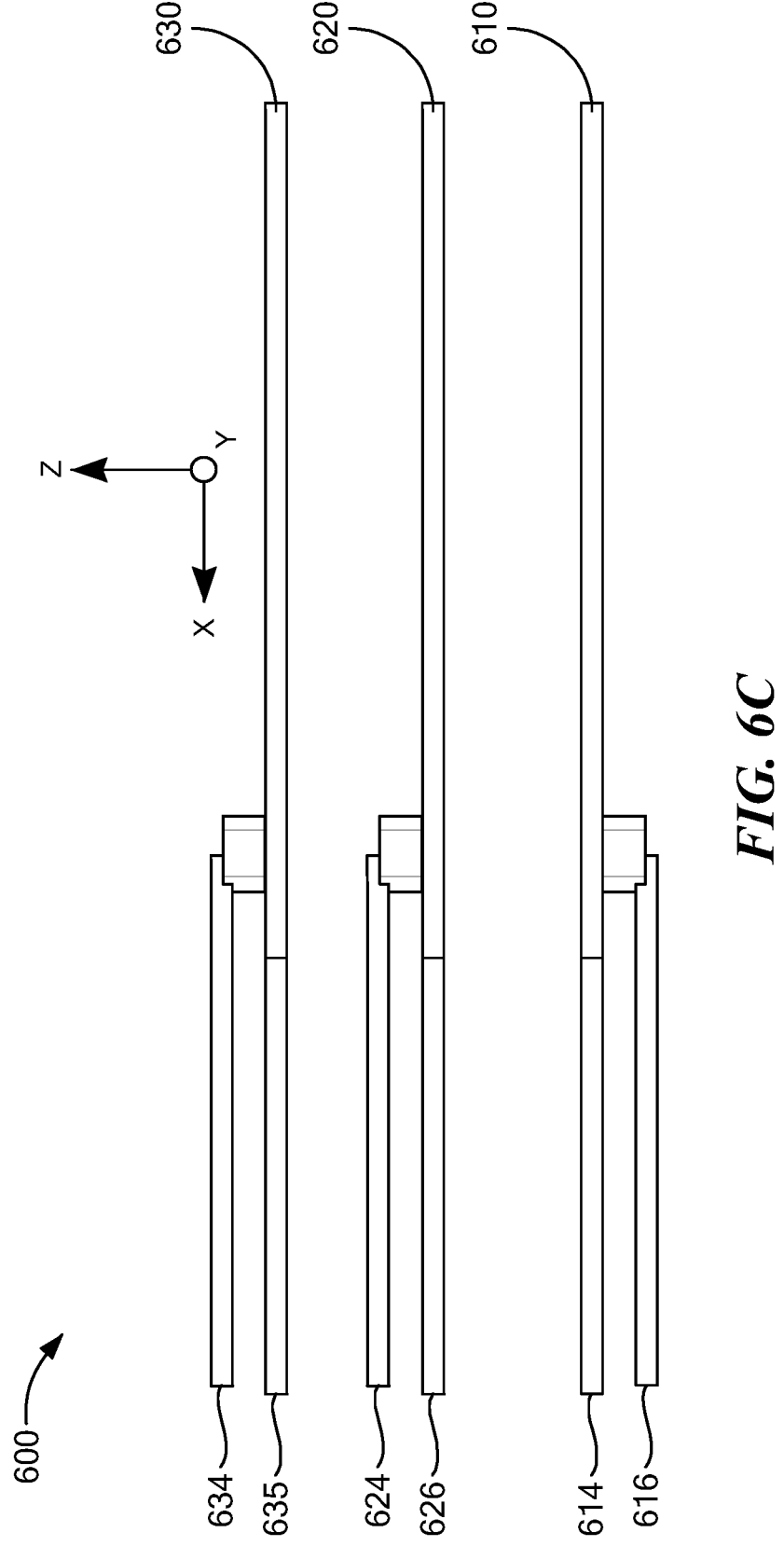

FIGS. 6A-6C are diagrams showing perspective, top, and side views, respectively, of an example transformer 600 having primary 610, secondary 620, and sense 630 coils, in accordance with the present disclosure. For the coil configuration shown for transformer 600, lower trace is the primary (input) coil 610, middle trace is the secondary (output) coil 620, and the upper trace is sense coil 630, which includes two parts, i.e., sense coil portions 631, 632. Primary coil 610 is shown with leads (traces) 614, 616. Secondary coil 620 is shown with leads (traces) 624, 626. Sense coil 630 is shown with leads (traces) 634, 636. The point between the two sense coil portions 631, 632 is shown with the trace 635, labelled Mid Sense Coil. In some examples, transformer 600 can be implemented on or in a suitable substrate, e.g., a printed circuit board (PCB), lead frame, etc.

FIG. 7 is a block diagram showing steps in an example fabrication method 700 for a voltage-isolated integrated circuit (IC) package with transformer and sense coils, in accordance with the present disclosure. For method 700, a substrate can be provided with first and second semiconductor dies, a.k.a., integrated circuit (IC) dies, as described at 702. The substrate can hold or support, directly or indirectly, the semiconductor dies (die or dice). First (e.g., input or primary) and second (e.g., output or secondary) coils can be provided in a transformer configuration, as described at 704. Method 700 can include coupling (providing) a resistive network in parallel with the output (secondary) coil, as described at 706. A sense coil (e.g., with first and second sense coil portions) can be provided adjacent the output (secondary) coil, e.g., configured as a current mirror, to reduce current produced in the resistive network resulting from a common mode transient event, as described at 708. The first and second semiconductor (IC) dies, the primary and secondary coils, and the sense coil (sense coil portions) can be covered with a molding material forming a package body, as described at 710. In some embodiments, the first and/or second semiconductor dies can be provided with an integrated circuit, e.g., a gate driver circuit, as described at 712.

Figure 8A:
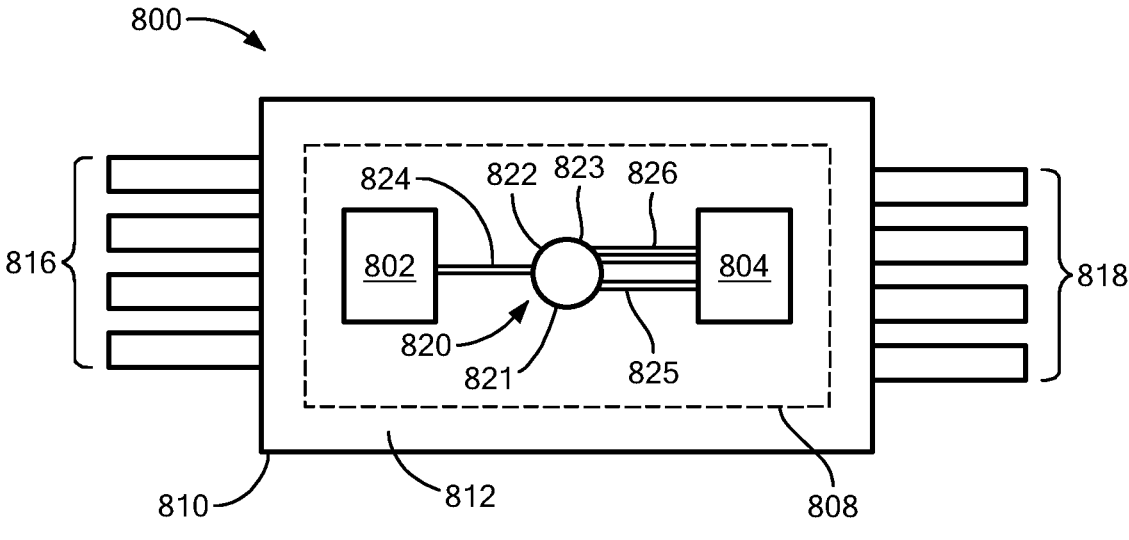
FIGS. 8A-8B are top and side views, respectively, of an example transformer-based isolator integrated circuit (IC) package including a sense coil, in accordance with the present disclosure.
Figure 8B:
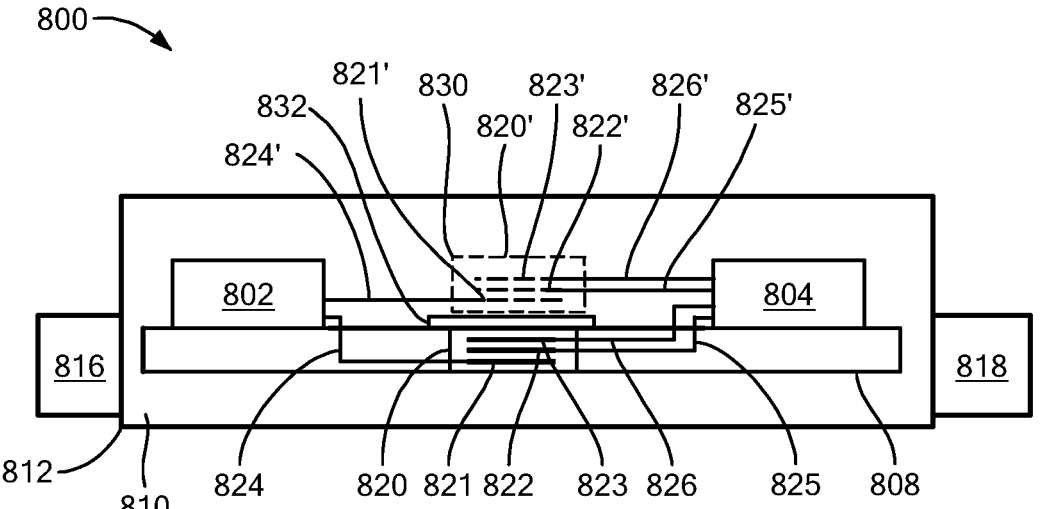

FIGS. 8A-8B are top and side views, respectively, of an example transformer-based isolator (voltage isolation) integrated circuit (IC) package 800 including a sense coil, in accordance with the present disclosure.

As shown in FIG. 8A, integrated circuit (IC) package 800 can include first and second semiconductor (a.k.a., integrated circuit) dies 802, 804 within package body 810. Dies 802 and 804 can be magnetically connected/coupled by transformer 820 having primary coil 821 and secondary coil 822, and also sense coil 823. Dies 802 and 804 may be disposed (directly or indirectly) on or supported by a substrate 808 (or other supporting platform), e.g., a printed circuit board (PCB) or lead frame, etc. First and second semiconductor (IC) dies 802 and 804 may be mounted directly or indirectly on portions of substrate 808, e.g., die pads of a lead frame, in some embodiments. Package body 810 may be formed of or include an insulating and/or protective material 812, e.g., mold material, such as an epoxy mold material. Primary (input) coil 821 and secondary (output) coil 822 provide magnetic coupling of and galvanic isolation for dies 802 and 804 and/or one or more ICs included in dies 802, 804. Leads (traces) 824 connect primary coil 821 to first die 802. Leads (traces) 825 connect secondary coil 822 to second die 804. Leads (traces) 826 connect sense coil (sense coil portions) 823 to second die 804. Sense coil 823 may have one or more, e.g., two, sense coil portions (see e.g., FIG. 6A). Exterior leads 816 and 818 are included for connecting dies 802 and 804, respectively, to structure outside of package 800, e.g., one or more components/circuits/systems, for controlling (driving) a solid state power switch such as a SiC FET, GaN FET, MOSFET, IGBT, or the like. In some embodiments, the secondary (output) coil can be connected to a data receiver for controlling a solid state (power) switch such as a SIC FET, GaN FET, MOSFET, IGBT, or the like.

FIG. 8B is a diagram showing a side view of the integrated circuit package 800 of FIG. 8A. A first embodiment is shown having transformer 820 disposed (included) within substrate 808 (e.g., within layers of a first PCB). An alternate embodiment is also shown (by dashed lines) in which transformer 820' is disposed on/in a second substrate 830 (e.g., a portion of a PCB) mounted on substrate 808. Second substrate 830 may be mounted on an intermediate material/structure 832, e.g., insulating tape, in some embodiments.

In some examples and embodiments, a substrate, e.g., one or more circuit boards and/or lead frames, may have additional polymer or insulation layers, e.g., to comply with given isolation requirements. In some examples, a printed circuit board (PCB) may be replaced with a substrate, e.g., an alumina substrate, a multilayer glass substrate, a ceramic substrate, e.g., low-temperature co-fired ceramic (LTCC) or high-temperature co-fired ceramic (HTCC), etc.

In some examples and/or embodiments, conductive components, e.g., integrated circuits (ICs) in dies 802, 804, in the main body 810 can be fabricated or configured to have a desired separation distance (d) between certain parts or features, e.g., to meet internal creepage or external clearance requirements for a given pollution degree. For example, a separation distance may be between closest voltage points or voltage regions of the respective circuits, e.g., the low (primary) side and high (secondary) side of a transformer. For further example, such a separation distance may be the distance between any two voltage points/regions between the primary and secondary sides, e.g., between die 802 and die 804 in FIG. 8, may be at least 1.2 mm, 1.4 mm, 1.5 mm, 3.0 mm, 4.0 mm, 5.5 mm, 7.2 mm, or 8.0 mm in respective examples. A distance between conductive portions of dies or circuit portions can include any insulation covering a conductor, e.g., such as plastic coating of a wire/lead. In some embodiments, distances between parts of package 800 may also be designed and implemented. In some examples and embodiments, the distance between conductor portions between ICs in dies 802 and 804, respectively, may be 1 mm, 1.2 mm, 1.4 mm, 1.5 mm, 2 mm, 4 mm, 6 mm, 7.2 mm, 10 mm, or more (10+mm), e.g., to meet a given voltage isolation requirement, including creepage requirement(s) for a given pollution degree rating as defined by certain safety standards bodies such as the Underwriters Laboratories (UL) and/or the International Electrotechnical Commission (IEC). Distance(s) between any conductor and the exterior environment of the package (e.g., represented by the bottom and/or side in the figure) can also selected/implemented as desired for fabrication of package 800 or other packages within the scope of the present disclosure.

In some embodiments, a dielectric material (e.g., gel) may be used for potting and/or protecting packages and/or PCB system assemblies, e.g., package 800, to protect dies and/or interconnects from environment conditions and/or to provide dielectric insulation. In some examples, a dielectric material may include, but is not limited to, one or more of the following materials: DOWSIL™ EG-3810 Dielectric Gel (made available by The Dow Chemical Corporation, a.k.a., "Dow", and DOWSIL™ EG-3896 Dielectric Gel (made available by Dow), which has the ability to provide isolation greater than 20 kV/mm. Other suitable gel materials may also or instead be used, e.g., to meet or facilitate meeting/achieving voltage isolation specifications required by a given package design. DOWSIL™ EG-3810 is designed for temperature ranges from −60° C. to 200° C. and DOWSIL™ EG-3896 Dielectric Gel −40° C. to +185° C.; both of which can be used to meet typical temperature ranges for automotive applications.

Accordingly, embodiments of the inventive subject matter can afford various benefits relative to prior art techniques. For example, embodiments and examples of the present disclosure can increase the robustness of isolated gate drivers with respect to common mode transients and noise.

Various embodiments of the concepts, systems, devices, structures, and techniques sought to be protected are described above with reference to the related drawings. Alternative embodiments can be devised without departing from the scope of the concepts, systems, devices, structures, and techniques described. For example, in some examples and/or embodiments, a transformer can include a transformer core, e.g., of ferromagnetic material. For further example, while embodiments and examples are described herein and shown in the drawings as generally including transformer/sense coils having an integer number of windings, turns, or loops e.g., 1, 2, etc., other examples and/or embodiments of the present disclosure may include a different number of transformer windings, turns, or loops, including a fractional number, e.g., 1.5, 2.5, 1.75, 1.8, 2.25, etc.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration." Any embodiment or design described as "exemplary" is not necessarily to be construed as preferred or advantageous over other embodiments or designs. The terms "one or more" and "at least one" indicate, unless expressly stated otherwise herein, any integer number greater than or equal to one, e.g., one, two, three, four, etc. The term "plurality" indicates any integer number greater than one. The term "connection" can include an indirect "connection" and a direct "connection."

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the description provided herein or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A galvanically-isolated integrated circuit (IC) package with high common mode noise rejection, the IC package comprising:
   a substrate;
   first and second semiconductor dies disposed on the substrate;
   a molding material configured to cover a portion of the substrate and forming a package body;
   an input coil disposed within the package body;
   an output coil disposed within the package body;
   wherein the input and output coils are configured as a transformer and connected to the first and second semiconductor dies, respectively;
   a resistive network coupled in parallel with the output coil; and
   a sense coil configured in parallel with the output coil, wherein the sense coil is configured for magnetic coupling with the output coil; and
   wherein the sense coil is configured to, in response to a common mode transient event producing current flow between the input and output coils due to capacitive coupling, accommodate a current flowing in the sense coil and thereby reduce current produced in the resistive network resulting from the common mode transient event.

2. The IC package of claim 1, wherein the output coil comprises first and second portions.

3. The IC package of claim 2, wherein the sense coil comprises first and second portions connected in series and configured in parallel with the first and second portions of the output coil.

4. The IC package of claim 1, wherein the resistive network comprises first and second resistors connected in series.

5. The IC package of claim 1, wherein the first and/or second semiconductor die comprises an integrated circuit.

6. The IC package of claim 5, where the integrated circuit comprises a gate driver circuit.

7. The IC package of claim 5, wherein the integrated comprises a controller circuit.

8. The IC package of claim 5, wherein the gate driver circuit comprises a power switch.

9. The IC package of claim 8, wherein the power switch is configured to control a semiconductor power device.

10. The IC package of claim 9, wherein the semiconductor power device comprises a metal-oxide-semiconductor field-effect transistor (MOSFET), an insulated-gate bipolar transistor (IGBT), a silicon carbide FET (SIC FET), a gallium nitride FET (GaN FET), or a high-electron-mobility transistor (HEMT).

11. The IC package of claim 1, wherein the substrate comprises a lead frame with first and second lead frame portions configured to receive the first and second semiconductor dies, respectively.

12. The IC package of claim 1, wherein the substrate comprises a printed circuit board (PCB).

13. The IC package of claim 12, wherein the PCB comprises FR-4.

14. The IC package of claim 1, wherein the substrate comprises alumina.

15. A method of making a galvanically-isolated integrated circuit package, the method comprising:
   providing a substrate supporting first and second semiconductor dies;
   providing input and output coils in a transformer configuration, wherein the input and output coils are connected to the first and second semiconductor dies, respectively;
   providing a resistive network coupled in parallel with the output coil;
   providing a sense coil adjacent the output coil, wherein the sense coil is configured to, in response to a common mode transient event producing current flow between the input and output coils due to capacitive coupling, accommodate a current flowing in the sense coil and thereby reduce current produced in the resistive network resulting from the common mode transient event; and
   covering the first and second semiconductor dies, the input and output coils, and sense coil with a molding material forming a package body.

16. The method of claim 15, wherein the output coil comprises first and second portions.

17. The method of claim 16, wherein the sense coil comprises first and second portions connected in series and configured in parallel with the first and second portions of the output coil.

18. The method of claim 15, wherein the resistive network comprises first and second resistors connected in series.

19. The method of claim 15, further comprising connecting the output coil to a data receiver for controlling a solid state switch.

20. The method of claim 15, wherein the first and/or second semiconductor die comprises an integrated circuit.

21. The method of claim 20, wherein the integrated circuit comprises a gate driver.

22. The method of claim 20, wherein the integrated circuit comprises a controller circuit.

23. The method of claim 21, wherein the gate driver circuit comprises a power switch.

24. The method of claim 23, wherein the power switch is configured to control a semiconductor power device.

25. The method of claim 24, wherein the semiconductor power device comprises a metal-oxide-semiconductor field-effect transistor (MOSFET), a gallium nitride (GaN) FET, a silicon carbide (SIC) FET, an insulated-gate bipolar transistor (IGBT), or a high-electron-mobility transistor (HEMT).

26. The method of claim 15, wherein the substrate comprises a lead frame with first and second lead frame portions configured to receive the first and second semiconductor dies, respectively.

27. The method of claim 15, wherein the substrate comprises a printed circuit board (PCB).

28. The method of claim 27, wherein the PCB comprises FR-4.

29. The method of claim 15, wherein the substrate comprises alumina.

* * * * *